(12) United States Patent
Wang et al.

(10) Patent No.: US 9,455,159 B2
(45) Date of Patent: Sep. 27, 2016

(54) FABRICATION METHOD OF PACKAGING SUBSTRATE

(71) Applicant: Siliconware Precision Industries Co., Ltd., Taichung (TW)

(72) Inventors: Wei-Ping Wang, Taichung (TW); Pang-Chun Lin, Taichung (TW); Chin-Chih Hsiao, Taichung (TW); Kuan-I Cheng, Taichung (TW); Cheng-Wen Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/866,106

(22) Filed: Sep. 25, 2015

(65) Prior Publication Data

US 2016/0013074 A1    Jan. 14, 2016

Related U.S. Application Data

(62) Division of application No. 13/566,265, filed on Aug. 3, 2012, now Pat. No. 9,171,741.

(30) Foreign Application Priority Data

Nov. 7, 2011   (TW) .............................. 100140495 A

(51) Int. Cl.
   *H01L 21/48*   (2006.01)
   *H01L 23/498*  (2006.01)
   *H01L 21/56*   (2006.01)
   *H01L 23/31*   (2006.01)
   *H01L 23/00*   (2006.01)

(52) U.S. Cl.
   CPC ....... *H01L 21/4857* (2013.01); *H01L 21/4846* (2013.01); *H01L 21/56* (2013.01); *H01L 23/49822* (2013.01); *H01L 24/85* (2013.01); *H01L 23/3121* (2013.01); *H01L 24/48* (2013.01); *H01L 2224/48227* (2013.01); *H01L 2224/48228* (2013.01); *H01L 2224/73265* (2013.01)

(58) Field of Classification Search
   CPC ................... H01L 21/4846; H01L 23/49822; H01L 2224/48227; H01L 2224/73265; H01L 24/48; H01L 2224/48228; H01L 23/3121
   See application file for complete search history.

(56) References Cited

U.S. PATENT DOCUMENTS 5,216,278 A    6/1993  Lin et al.
2013/0234337 A1  9/2013  Hsu et al.

*Primary Examiner* — David Vu
(74) *Attorney, Agent, or Firm* — Mintz Levin Cohn Ferris Glovsky and Popeo, P.C.; Peter F. Corless; Steven M. Jensen

(57) ABSTRACT

A method for fabricating a packaging substrate includes: providing a carrier having a first metal layer and a second metal layer formed on the first metal layer; forming a first circuit layer on the second metal layer and forming a separating portion on an edge of the second metal layer such that the separating portion is spaced from the first circuit layer; forming a dielectric layer on the second metal layer and the first circuit layer such that the first circuit layer and the separating portion are embedded in the dielectric layer and portions of the dielectric layer are formed between the first circuit layer and the separating portion; forming a second circuit layer on the dielectric layer; and applying forces on the separating portion so as to remove the first metal layer and the carrier, thereby maintaining the integrity of the first circuit layer.

5 Claims, 2 Drawing Sheets

FABRICATION METHOD OF PACKAGING SUBSTRATE

CROSS-REFERENCE TO RELATED APPLICATIONS

This application is a divisional of copending application U.S. Ser. No. 13/566,265, filed on Aug. 3, 2012, which claims under 35 U.S.C. §119(a) the benefit of Taiwanese Application No. 100140495, filed Nov. 7, 2011, the entire contents of which are incorporated herein by reference.

BACKGROUND OF THE INVENTION

1. Field of the Invention

The present invention relates to packaging substrates and fabrication methods thereof, and, more particularly, to a packaging substrate for carrying a semiconductor chip and a fabrication method thereof.

2. Description of Related Art

Along with the rapid development of electronic industries, electronic products are developed towards multi-function and high performance. Packaging substrates used for carrying semiconductor chips are required to have reduced thicknesses to meet the miniaturization requirement of semiconductor packages.

However, decreasing thickness of packaging substrates increases problems in fabrication. For example, such a packaging substrate can easily get stuck when it is moved across various processing stations, thus adversely affecting the fabrication efficiency. Further, such a packaging substrate can easily warp or crack due to its reduced thickness, which accordingly leads to an undesired product yield.

Therefore, small leadless packages (SLPs) are provided. In particular, a carrier is added to one side of a packaging substrate during fabrication and removed after the molding process, thereby meeting miniaturization requirement, facilitating mass production and reducing fabrication cost.

Referring to FIG. 1A, a packaging substrate 1 used in a small leadless package has a carrier 10 having a first copper lamination layer 101 and a second copper lamination layer 102 formed on the first copper lamination layer 101, and a base body 1a disposed on the second copper lamination layer 102. The first and second copper lamination layers 101, 102 are laminated together through vacuum lamination.

The base body 1a has a first circuit layer 11 formed on the second copper lamination layer 102 through electroplating, a dielectric layer 12 formed on the second copper lamination layer 102 and the first circuit layer 11, a second circuit layer 13 formed on the dielectric layer 12 through electroplating, a plurality of conductive vias 14 formed in the dielectric layer 12 through electroplating for electrically connecting the first and second circuit layers 11, 13, and an protection layer 15 formed on the dielectric layer 12 and the second circuit layer 13.

Referring to FIG. 1B, the first copper lamination layer 101 is separated and removed from the second copper lamination layer 102 through a vacuum breaking process so as to remove the carrier 10.

However, since the first circuit layer 11 is made of an electroplated copper material, the bonding force between the first circuit layer 11 (electroplated copper) and the second copper lamination layer 102 (laminated copper) is greater than the bonding force between the first circuit layer 11 (electroplated copper) and the dielectric layer 12 (non-metal material). As such, when the first copper lamination layer 101 is removed along with an edge portion of the second copper lamination layer 102a, a portion of the first circuit layer 11a is also removed due to the great bonding force between the second copper lamination layer 102a and the first circuit layer 11a, thereby damaging the first circuit layer 11 and reducing the product yield.

Therefore, there is a need to provide a packaging substrate and a fabrication method thereof so as to overcome the above-described drawbacks.

SUMMARY OF THE INVENTION

Accordingly, the present invention provides a fabrication method of a packaging substrate, which comprises the steps of: providing a carrier having a first metal layer and a second metal layer laminated on the first metal layer; forming a first circuit layer on the second metal layer and forming a separating portion on an edge of the second metal layer such that the separating portion is spaced from the first circuit layer; forming a dielectric layer on the second metal layer and the first circuit layer such that the first circuit layer and the separating portion are embedded in the dielectric layer and a portion of the dielectric layer is positioned between the first circuit layer and the separating portion; forming a second circuit layer on the dielectric layer and forming a plurality of conductive vias in the dielectric layer for electrically connecting the first and second circuit layers; and removing the separating portion along with a portion of the second metal layer under the separating portion so as to remove the first metal layer and the carrier along an edge of the carrier, thereby forming a recess portion on an edge of the dielectric layer and maintaining the remaining portion of the second metal layer on the dielectric layer and the first circuit layer, wherein the recess portion is exposed from the remaining portion of the second metal layer.

The present invention further provides a packaging substrate, which comprises: a carrier having a first metal layer and a second metal layer laminated on the first metal layer; a first circuit layer formed on the second metal layer; a separating portion formed on an edge of the second metal layer; a dielectric layer formed on the second metal layer such that the first circuit layer and the separating portion are embedded in the dielectric layer and a portion of the dielectric layer is positioned between the first circuit layer and the separating portion; and a second circuit layer formed on the dielectric layer, wherein portions of the second circuit layer are embedded in the dielectric layer for electrically connecting the first circuit layer.

In the above-described packaging substrate and fabrication method, the first metal layer and the second metal layer are laminated together through vacuum lamination.

The present invention further provides another packaging substrate, which comprises: a dielectric layer having a first surface with a recess portion on an edge thereof and a second surface opposite to the first surface; a first circuit layer embedded in the first surface of the dielectric layer, wherein a portion of the dielectric layer is positioned between the first circuit layer and the recess portion; a metal layer formed on the first surface of the dielectric layer and the first circuit layer while exposing the recess portion; and a second circuit layer formed on the second surface of the dielectric layer, wherein portions of the second circuit layer are embedded in the dielectric layer for electrically connecting the first circuit layer.

In the above-described packaging substrates and fabrication method, an protection layer can be formed on the dielectric layer and the second circuit layer and have a plurality of openings for exposing portions of the second circuit layer. Further, a surface treatment layer can be formed on the portions of the second circuit layer exposed through the openings of the protection layer.

Furthermore, a semiconductor chip can be disposed on the protection layer and electrically connected to the second circuit layer through a plurality of bonding wires, and an encapsulant can be formed on the protection layer for encapsulating the semiconductor chip and the bonding wires.

Therefore, by forming a separating portion on an edge of the second metal layer and forms a dielectric layer between the first circuit layer and the separating portion, the present invention allows forces to be applied on the separating portion and a portion of the second metal layer under the separating portion so as to remove the first metal layer and the carrier. Since the bonding force between the dielectric layer and the second metal layer is greater than the bonding force between the two metal layers, the second metal layer remains on the dielectric layer without being removed. As such, the present invention avoids removal of the second metal layer along with the first circuit layer as occurs in the prior art, thereby keeping the integrity of the first circuit layer and improving the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

Figure 1A:
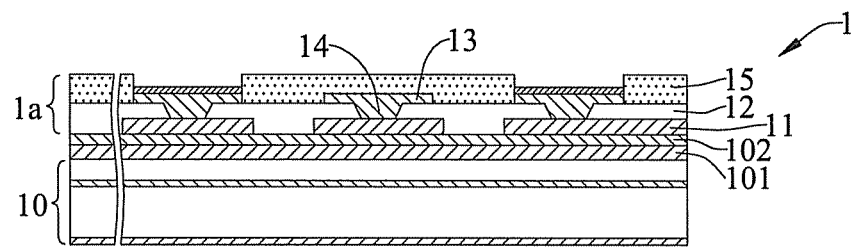
FIGS. 1A and 1B are schematic cross-sectional views showing a fabrication method of a conventional packaging substrate.
Figure 1B:
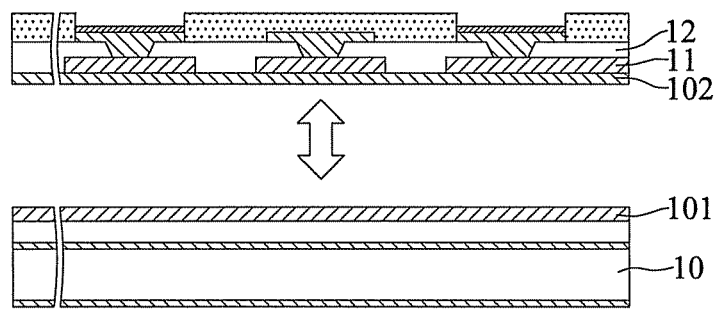
Figure 1C:
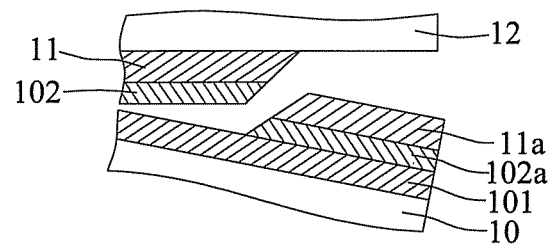
FIG. 1C is a partially enlarged view of FIG. 1B.
Figure 2A:
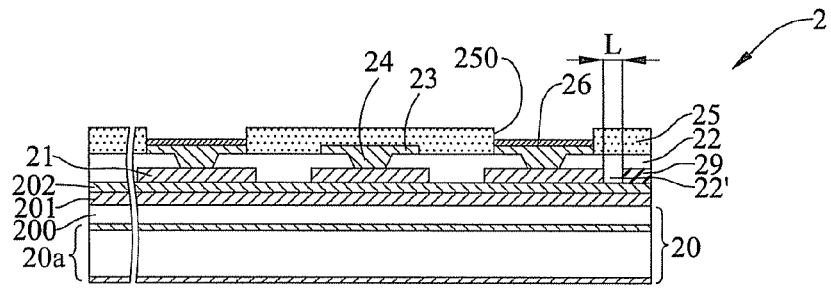
FIGS. 2A and 2B are schematic cross-sectional views showing a fabrication method of a packaging substrate according to the present invention, wherein FIG. 2A' is an upper view of FIG. 2A.
Figure 2A:
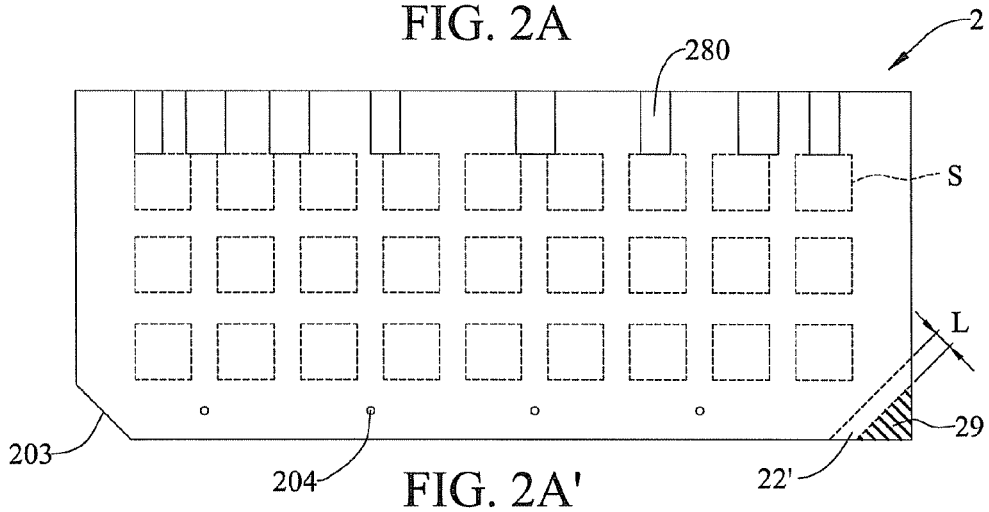
Figure 2B:
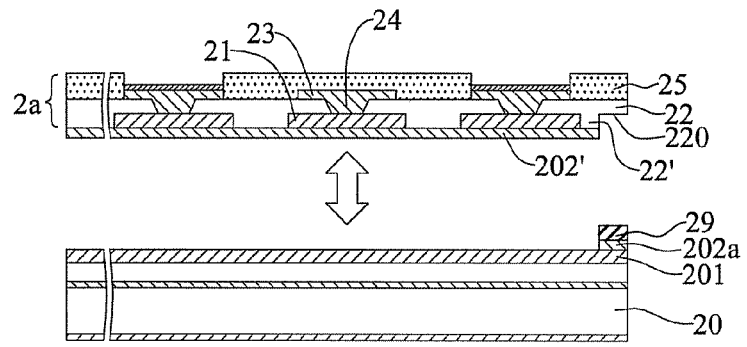

FIGS. 2A and 2B are schematic cross-sectional views showing a fabrication method of a packaging substrate according to the present invention.

Referring to FIGS. 2A and 2A', a carrier 20 has a copper clad laminate (CCL) 20a and a bonding layer 200 formed on the copper clad laminate 20a. A first metal layer 201 is formed on the bonding layer 200 and a second metal layer 202 is laminated on the first metal layer 201.

Then, through an electroplating process, a first circuit layer 21 is formed on the second metal layer 202, and a separating portion 29 is formed on an edge of the second metal layer 202 such that a gap L is formed between the first circuit layer 21 and the separating portion 29.

Then, a dielectric layer 22 is formed on the second metal layer 202 and the first circuit layer 21 such that the first circuit layer 21 and the separating portion 29 are embedded in the dielectric layer 22 and a portion of the dielectric layer 22' is positioned in the gap L between the first circuit layer 21 and the separating portion 29.

Thereafter, through an electroplating process, a second circuit layer 23 is formed on the dielectric layer 22 and a plurality of conductive vias 24 are formed in the dielectric layer 22 for electrically connecting the first and second circuit layers 21, 23.

Further, an protection layer 25 is formed on the dielectric layer 22 and the second circuit layer 23 and has a plurality of openings 250 formed therein such that portions of the second circuit layer 23 are exposed through the openings 250 to serve as conductive pads. Furthermore, a surface treatment layer 26 can be formed on the portions of the second circuit layer 23 exposed through the openings 250 of the protection layer 25.

In the present embodiment, the first metal layer 201 and the second metal layer 202 are made of copper. The first metal layer 201 and the second metal layer 202 are laminated together through vacuum lamination. The bonding layer 200 can be made of a dielectric material, an insulating material or an adhesive material. Various types of copper clad laminates are well known in the art and detailed description thereof is omitted herein.

The dielectric layer 22 is made of prepreg (PP). The first circuit layer 21 and the separating portion 29 are made of copper. The first circuit layer 21 and the separating portion 29 can be simultaneously fabricated through electroplating. Related circuit fabrication processes are well known in the art and have no special limitations.

The surface treatment layer 26 is made of Ni/Au, electroless nickel/electroless palladium/immersion gold (EN-EPIG) or direct immersion gold (DIG).

Further, referring to FIG. 2A', the separating portion 29 is located on a corner of the packaging substrate so as to function as a staring point for a subsequent removal process. Dashed rectangles S in FIG. 2A' define a plurality of substrate units for mounting semiconductor chips. After a molding process, the substrate units can be singulated into a plurality of package units. Further, the packaging substrate 2 has a positioning cutting corner 203, a plurality of positioning holes 204 at an edge thereof and molding gates 280 used for a subsequent molding process.

Referring to FIG. 2B, the dielectric layer 22' between the first circuit layer 21 and the separating portion 29 is laminated with the second metal layer 202, and the bonding force between the dielectric layer 22' and a laminated copper material, i.e., the second metal layer 202 is greater than the bonding force between two laminated copper materials, i.e., the first and second metal layers 201,202.

To remove the first metal layer 201 through a vacuum breaking process, forces are applied on the separating portion 29 (electroplated copper) and a portion of the second metal layer 202a under the separating portion 29a. Since the bonding force between electroplated copper and laminated copper is greater than the bonding force between electroplated copper and non-metal material, the separating portion 29 and the portion of the second metal layer 202a under the separating portion 29a are removed to thereby remove the first metal layer 201 and the carrier 20 along an edge of the carrier 20.

Since the bonding force between the dielectric layer 22' and the second metal layer 202 is greater than the bonding force between the first metal layer 201 and the second metal layer 202, the dielectric layer 22' and the second metal layer 202 are securely laminated together such that when the edge portion 202a of the second metal layer is removed, the second metal layer 202 remains on the dielectric layer 22' without being removed. Therefore, the present invention avoids removal of the first circuit layer 21 as in the prior art and maintains the integrity of the first circuit layer 21.

After the first metal layer 201 and the carrier 20 are removed, a recess portion 220 is formed on an edge of the dielectric layer 22, the second metal layer 202' remains on the dielectric layer 22 and the first circuit layer 21 and the recess portion 220 is exposed from the second metal layer 202'.

Figure 2C:
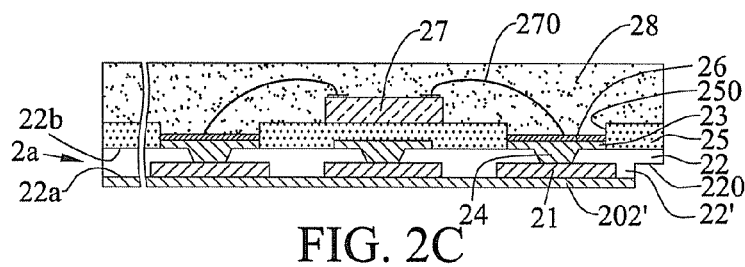
FIG. 2C shows a subsequent process of FIG. 2B.

Further referring to FIG. 2C, a semiconductor chip 27 is disposed on the protection layer 25 through the positioning cutting corner 203 (as shown in FIG. 2A') and positioning marks (not shown), and electrically connected to the second circuit layer 23 in the openings 250 through a plurality of bonding wires 270. Next, by performing a molding process using a mold and the molding gates 280 (as shown in FIG. 2A'), an encapsulant 28 is formed to encapsulate the semiconductor chip 27 and the bonding wires 270. The molding gates have a Ni/Au plating layer to facilitate removal of molding residues after the molding process. Some of the molding gates are disposed between at least two substrate units and some of the molding gates correspond in position to single substrate units. During the molding process, the mold is aligned with the packaging substrate through the positioning holes 204 (as shown in FIG. 2A'). In other embodiments, the molding process is performed before the removing process of FIG. 2B.

The present invention further provides a packaging substrate 2 as shown in FIG. 2A, which has: a carrier 20 having a first metal layer 201 and a second metal layer 202 laminated on the first metal layer 201, a first circuit layer 21 formed on the second metal layer 202, a separating portion 29 formed on an edge of the second metal layer 202; a dielectric layer 22 formed on the second metal layer 202 such that the first circuit layer 21 and the separating portion 29 are embedded in the dielectric layer 22 and a portion of the dielectric layer 22' is positioned between the first circuit layer 21 and the separating portion 29, a second circuit layer 23 disposed on the dielectric layer 22, and an protection layer 25 formed on the dielectric layer 22 and the second circuit layer 23.

The second circuit layer 23 has conductive vias 24 formed in the dielectric layer 22 for electrically connecting the first circuit layer 21.

The protection layer 25 has a plurality of openings 250 formed therein such that portions of the second circuit layer 23 are exposed through the openings 250 so as for a surface treatment layer 26 to be formed thereon.

The present invention further provides a packaging substrate 2a as shown in FIG. 2C, which has: a dielectric layer 22 having a first surface 22a and a second surface 22b opposite to the first surface 22a, a first circuit layer 21 embedded in the first surface 22a of the dielectric layer 22, a second metal layer 202' formed on the first surface 22a of the dielectric layer 22 and the first circuit layer 21, a second circuit layer 23 formed on the second surface 22b of the dielectric layer 22, and an protection layer 25 formed on the second surface 22b of the dielectric layer 22 and the second circuit layer 23.

The first surface 22a of the dielectric layer 22 has a recess portion 220 at an edge thereof, and a portion of the dielectric layer 22' is positioned between the first circuit layer 21 and the recess portion 220.

The first circuit layer 21 is flush with the first surface 22a of the dielectric layer 22.

The recess portion 220 is exposed from the second metal layer 202'.

The second circuit layer 23 has a plurality of conductive vias 24 formed in the dielectric layer 22 for electrically connecting the first circuit layer 21.

The protection layer 25 has a plurality of openings 250 formed therein such that portions of the second circuit layer 23 are exposed through the openings 250 so as for a surface treatment layer 26 to be formed thereon.

Therefore, the present invention forms a separating portion 29 on an edge of the second metal layer 202 such that forces can be applied on the separating portion 29 and a portion of the second metal layer 202a under the separating portion 29 to thereby remove the first metal layer 201 and the carrier 20, thereby maintaining the integrity of the first circuit layer 21 and improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a packaging substrate, comprising the steps of:
   providing a carrier having a first metal layer and a second metal layer formed thereon;
   forming a first circuit layer on the second metal layer and forming a separating portion on an edge of the second metal layer, wherein the separating portion is spaced from the first circuit layer;
   forming a dielectric layer on the second metal layer and the first circuit layer, so as for the first circuit layer and the separating portion to be embedded in the dielectric layer, and a portion of the dielectric layer to be positioned between the first circuit layer and the separating portion;
   forming a second circuit layer on the dielectric layer and forming a plurality of conductive vias in the dielectric layer for electrically connecting the first and second circuit layers; and
   removing the carrier and the first metal layer by the separating portion.

2. The fabrication method of claim 1, further comprising forming a protection layer on the dielectric layer and the second circuit layer and forming a plurality of openings in the protection layer for exposing portions of the second circuit layer.

3. The fabrication method of claim 2, further comprising disposing a semiconductor chip on the protection layer and electrically connecting the semiconductor chip and the second circuit layer through a plurality of bonding wires and forming an encapsulant on the protection layer for encapsulating the semiconductor chip and the bonding wires.

4. The fabrication method of claim 2, further comprising forming a surface treatment layer on the portions of the second circuit layer exposed through the openings of the protection layer.

5. The fabrication method of claim 1, wherein the first and second metal layers are laminated through vacuum lamination.

* * * * *